United States Patent
Byrn et al.

(10) Patent No.: US 7,380,229 B2
(45) Date of Patent: May 27, 2008

(54) AUTOMATIC GENERATION OF CORRECT MINIMAL CLOCKING CONSTRAINTS FOR A SEMICONDUCTOR PRODUCT

(75) Inventors: Jonathan W. Byrn, Kasson, MN (US); Matthew S. Wingren, Rochester, MN (US)

(73) Assignee: LSI Corporation, Milpitas, CA (US)

( * ) Notice: Subject to any disclaimer, the term of this patent is extended or adjusted under 35 U.S.C. 154(b) by 309 days.

(21) Appl. No.: 11/151,043

(22) Filed: Jun. 13, 2005

(65) Prior Publication Data
US 2006/0282808 A1    Dec. 14, 2006

(51) Int. Cl.
*G06F 17/50* (2006.01)
(52) U.S. Cl. .................. 716/6; 716/7; 716/18; 703/16
(58) Field of Classification Search .................. 716/6, 716/7, 18; 703/16
See application file for complete search history.

(56) References Cited

U.S. PATENT DOCUMENTS

| | | | | |
|---|---|---|---|---|
| 5,649,176 A * | 7/1997 | Selvidge et al. | ............ | 713/400 |
| 6,421,818 B1 * | 7/2002 | Dupenloup et al. | ........... | 716/18 |
| 6,442,739 B1 * | 8/2002 | Palermo et al. | ................. | 716/6 |
| 6,536,024 B1 * | 3/2003 | Hathaway | ....................... | 716/6 |
| 6,754,877 B1 * | 6/2004 | Srinivasan | ..................... | 716/2 |
| 6,785,873 B1 * | 8/2004 | Tseng | ............................. | 716/4 |
| 6,836,877 B1 * | 12/2004 | Dupenloup | .................. | 716/18 |
| 6,910,201 B2 * | 6/2005 | Byrn et al. | .................... | 716/17 |
| 7,003,741 B2 * | 2/2006 | Srinivasan | ..................... | 716/2 |
| 7,134,062 B2 * | 11/2006 | Yan | ............................. | 714/731 |
| 7,187,741 B2 * | 3/2007 | Pontius et al. | .............. | 375/372 |
| 7,296,246 B1 * | 11/2007 | Kuehlmann et al. | ........... | 716/2 |
| 2004/0210857 A1 * | 10/2004 | Srinivasan | ..................... | 716/2 |
| 2005/0198601 A1 * | 9/2005 | Kuang et al. | .................. | 716/6 |
| 2006/0117274 A1 * | 6/2006 | Tseng et al. | .................... | 716/1 |
| 2006/0123370 A1 * | 6/2006 | Vergara-Escobar | ............. | 716/6 |
| 2006/0230373 A1 * | 10/2006 | Dirks et al. | ..................... | 716/6 |

OTHER PUBLICATIONS

Littlefield, Jay and Sundaresan, Subash, Formal Approach eases multiple clock design, PlanetAnalog.com, May 20, 2004, 7 pages, http://www.planetanalog.com/printableArticle.jhtml?articleID+20900163.

Murphy, Bernard, Reducing false errors in clock-domain crossing analysis, PlanetAnalog.com, Jan. 17, 2005, 6 pages, http://www.planetanalog.com/showArticle.jhtml?articleID=57701580.

* cited by examiner

*Primary Examiner*—Phallaka Kik
(74) *Attorney, Agent, or Firm*—Eric James Whitesell (57) ABSTRACT

A electronic design automation tool, apparatus, method, and program product by which design requirements for an intended semiconductor product and the resource definitions of a semiconductor platform are input. From the design requirements and the resource definitions, parameters specific to clocking are derived, e.g., clock property information, clock domain crossing information, and clock relationship specification. The tool and method embodied therein validates the clocking parameters of the design requirements with the resource definitions and invokes errors if the parameters are not realizable. Once the desired clocking parameters are consistent with the actual clocking parameters, correct physical optimization constraints and timing constraints are generated for the clocks. An iterative process can achieve correct and minimal clocking constraints.

22 Claims, 10 Drawing Sheets

Clock Properties

| | | Clock Property Information | | | | | | | |
|---|---|---|---|---|---|---|---|---|---|
| Index | Clock Name | Clock Mode | Frequency | Divider | Alternate Clk | Osc Source Type | Osc Source Name | Osc Source Frequency | Reset Source Name |
| 1 | clk_1 | Nominal | 200.0 | 1 | | PLL | PLL_0 | 200.0 | Bump_02... |

Clock Relationship Specifications

AC    Related
    AB    Error-Not Specified
    AD    Related

| | Clock 1 | Clock 2 | Type | Attributes | Dir |
|---|---|---|---|---|---|
| 984 | cpu_clk | HSP_clk | Edge | ÷ n | Bi |
| | cpu_clk | LSP_clk | Edge | ÷ m | Bi |

| Clock 1 | Clock 2 | Type | Attributes | Dir |
|---|---|---|---|---|
| cpu_clk | HSP_clk | Edge | ÷ n | Bi |
| cpu_clk | LSP_clk | Edge | ÷ n | Bi |
| SSS0_Rx_clk_0<br>SSS0-Tx_clk_0 | SSS0_Rx_clk_1<br>SSS0_Tx_clk_1 | Edge | ÷ m<br>÷ 1 | Bi<br>SS0_Rx_clk_0 →<br>SS0_Tx_clk_0 |

Sample clock relationship for a single SERDES, could be replicated x times

AUTOMATIC GENERATION OF CORRECT MINIMAL CLOCKING CONSTRAINTS FOR A SEMICONDUCTOR PRODUCT

FIELD OF THE INVENTION

This invention relates generally to the field of electronic circuit design and more particularly relates to simplifying how clocking constraints are generated for a semiconductor product.

BACKGROUND

Integrated circuits and chips have become increasingly complex with the speed and capacity of chips significantly increasing about every eighteen months because of advances in design software, fabrication technology, semiconductor materials, and chip design. The increased density of transistors per square centimeter and more sophisticated clocking schemes required to effectively utilize all of those transistors, however, make it increasingly difficult to create minimal yet sufficient clock related design constraints. The proper specification of these constraints is essential in order to ensure that the circuits perform as desired. Unanticipated and sometimes subtle interactions between different clocks and the circuits that use them can lead to issues in design closure as well as the correct operation of the circuits themselves. These difficulties increase the expense and risk of designing and fabricating chips whether they be platform ASICs, ASICs, FPGAs, or fully custom semiconductor products. Indeed, despite the complexity and expense, the demand for custom-designed integrated circuits increases. A key problem in the delivery of these circuits is that of design closure, and a key component of design closure is creating the constraints for the tools that perform design closure, and among the most important constraints are the clocking constraints. The clocking constraints, moreover, should be just enough and no more, i.e., correct and minimal. Every unnecessary constraint burdens the design system with unnecessary restrictions that are harder to resolve and close. At the same time, however, any missing clocking constraints can result in circuit failure.

Clock constraints are a key constituent of logical and physical optimization and static timing analysis. In a synchronous design, data is "launched" from a storage element based on the transition of a clock and data is captured in a storage element based on the transition of a clock. The launch and capture clock may be the same clock or may be different clocks. A set of minimal clock constraints describe the nature of the interaction in either case. For example if a clock has a ten nanosecond period and the launch and capture clock are shared then the time available to perform an operation on the data is ten nanoseconds less aggregate clock uncertainty. There are many factors that affect the aggregated clock uncertainty but the net effect of the sum of all the uncertainties is a reduction in the amount of time a circuit has to complete its operation on the data in question. If the circuit cannot deliver the data from one stage to the next during the allotted time then the circuit does not operate as intended, the data is lost, and the cost for the design, development, and production of the semiconductor product is wasted. This is a simple example. There are more complex scenarios but the net effect is the same: if the data fails to propagate correctly, the circuit effectively fails. If the design closure tools do not have a correct clocking constraints, it is very likely that failing circuits will be produced.

At the same time creating overly restrictive constraints often results in a case where the design tools cannot close the design without significant rework that is also time consuming and expensive. If there were only one or two clocks in a semiconductor product, the problem would be simple but today chips such as those referred to as "systems-on-a-chip" may have hundreds of clocks with a great many clock domain crossings. In addition the logic involved in domain crossing may serve more than one function and performance level. The result is a complex collection of clocks and clock interactions that is very difficult to unknot. Manually unknotting these interactions is difficult, time consuming and error prone.

In the design, a clock will clock memory elements within part of the design. The section of logic driven by a clock is called a clock domain. The interface boundaries between clock domains are called the clock domain crossings (CDC). When data passes from one clock domain to another, key questions need to be answered. Do the clocks involved share a common source clock somewhere in the system; for example, do the clocks share the same phase locked loop (PLL) or primary input/output (I/O) as a clock source? If so, must specific phase relationships between the common source and/or the clocks be maintained? If not, then does an asynchronous domain crossing circuit that offers appropriate predictability need to be placed at the interface of the clock domain crossing?

The answers to these kinds of questions have direct implications for design closure and design functionality. In the case of an asynchronous domain crossing design, closure is more relaxed. This relaxation, however, comes at a price, typically at the expense of logical signal/data latency. This occurs because there is no way to know which exact cycle information will cross an interface. This may result in cycles of delay. So while design closure is easier, the efficiency of the logic is reduced which is often a critical factor in many interfaces. On the other hand, when clocks are related by definition, design closure is more difficult and the optimization tools have a much harder problem to solve. Interface latency, however, can be minimized given the nature of the relationship and, indeed, should be faster than the case where the clocks are not related. As the number of relationships increase, the degree of difficulty in solving the problem increases significantly because solving one case may actually harm another case.

Today the creation of these constraints is an intensive, slow, iterative process requiring much analysis; the process is very error prone. The technique usually involves generating a trial set of constraints, trying these constraints in the closure tools, and then analyzing the results. The constraints are then modified and the cycle repeats. The run time for creating and analyzing the results can range from hours to days and the process may need to be repeated many many times. In addition it is very possible to introduce an error that is undetectable until after the silicon has been fabricated, such as when a false path is set where it shouldn't be or when an asynchronous domain fails to have a correct domain crossing circuit. The result is a set of paths that pass through the design closure process but fail to function as intended. Such errors typically require a "respin" of the chip that sends a chip back to the drawing board, requiring new masks and costing millions. So, in the end, both too many and too few clocking constraints can cause failure. In addition these constraints are created over time through an iterative process, so it is possible to have the clocking constraints be correct for some period of time and then later be incorrect because of logic changes. So there is also regular maintenance aspect as well. Keeping track of all the possibilities and changes can be daunting, especially if there are hundreds of clocks in the design.

There is thus a need in the industry to automate and streamline the process of finding and calculating the proper minimal set of clocking constraints across an integrated circuit product. In addition, developers need a tool that can design these clocking constraints solutions and be compatible with a myriad of electronic design automation (EDA) tools.

SUMMARY OF THE INVENTION

The techniques disclosed herein provide an electronic design automation tool and method that automatically generates and checks a proper minimal set of clocking constraints for a semiconductor product. The invention uses clock specification data coupled with checking and analysis tools to carry out its algorithms. Use of the tools significantly reduces development time and produces higher quality.

Thus, the invention may be considered a method, an apparatus, an electronic design automation tool, and a computer program product to generate clock constraints for a design flow of a semiconductor product, having the ability to input resource definitions of a semiconductor platform having least one clocking function; input design requirements of at least one desired clocking function to be implemented on the semiconductor product; and determine if the design requirements are consistent with and physically realizable from the resource definitions; if so, then creating a set of clocking constraints; and automatically generating correct and minimal clock constraints for the semiconductor product. Clock property information, clock domain crossing information, and clock relationship specifications are derived from the resource definitions and the design requirements. The clock relationships are validated with the clock property information and with the clock domain crossing. The clocking functions may be internally derived or imported from an source external to the semiconductor product.

The invention will further indicate specific errors when the design requirements are not consistent and not physically realizable from the resource definitions, and may further suggest modifying the resource definitions or modifying the design requirements until the clock relationships are valid with the clock property information and the clock domain crossing information is valid with the clock relationships. Once consistency is achieved, the inventive method, tool, and computer program product can create a set of clocking constraints and then, in an iterative process, and generate correct and minimal clock constraints for the semiconductor product. The clock constraints comprise timing constraints and physical optimization constraints.

The electronic design automation tool that generates clock constraints for a semiconductor product, comprises a first validator to determine if a clock relationship specification derived from resource definitions is consistent with clock property information also derived from the resources definition; and a second validator to validate clock domain crossing information derived from the resource definitions and design requirements. The tool may also have a first error indicator to indicate that the first validator determined that the clock relationship specification is not consistent with the clock property information; and/or a second error indicator to indicate that the second validator determined that clock domain crossing information is not consistent with the clock relationship specification. The tool also may include a clock constraint generator that generates correct and minimal timing and physical optimization constraints when the clock domain crossing information and the clock property information and the clock relationship specification are all consistent with each other.

BRIEF DESCRIPTION OF THE DRAWINGS

The numerous advantages of the present invention may be better understood by reference to the accompanying figures in which.

DESCRIPTION OF THE INVENTION

The present invention now will be described more fully hereinafter with reference to the accompanying drawings in which illustrative embodiments of the invention are shown. This invention may, however, be embodied in many different forms and should not be construed as limited to the embodiments set forth herein; rather, these embodiments are provided so that this disclosure will be thorough, complete, and will fully convey the scope of the invention to those skilled in the art. Like numbers refer to like elements throughout.

Figure 1:
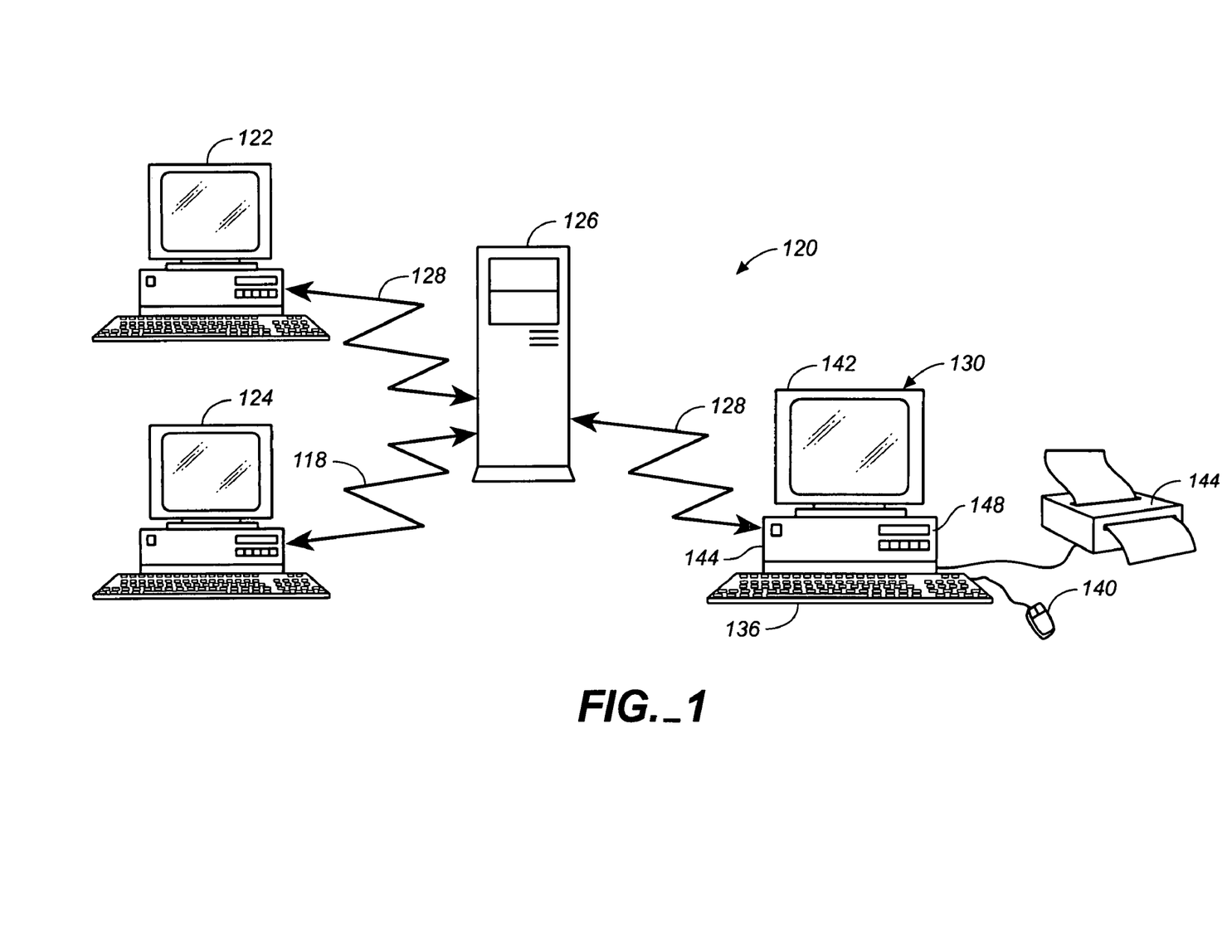
FIG. 1 a simplified block diagram of a networked computer system upon which a tool to design a set of minimal correct clock constraints for a semiconductor product can be installed and used.

Referring to FIG. 1, which illustrates an exemplary networked computer system 120 upon which a tool to generate a correct and minimal clock specification including timing and physical optimization constraints during the design flow of a semiconductor product as disclosed herein, could be installed and/or used. Computer system 120 is illustrated as a networked computer system that includes one or more client computers 122, 124 and 130 such as workstations coupled through a network 128 to a server 126. Server 126 could also be a personal computer, a workstation, a midrange computer, or a mainframe computer. While shown here as a point-to-point connection, computers 122 and 124 need not be coupled to server 126 directly, but may be coupled to yet another network which in turn is connected to server 126. Network 128 represents any type of networked interconnection including but not limited to local-area, wide-area, wireless, and public networks such as the Internet or an Intranet, and any number of routers and hubs connected in between, e.g., a local-area network to a wide-area network to the Internet through a series of routers and/or other servers. Any number of computers and other devices may be networked through network 128, e.g., multiple servers, hand-held devices, etc.

For the purposes of the invention, computer 130 may represent practically any type of computer, computer system, or other programmable electronic device, including a client computer similar to computers 122, 124, a server computer, e.g., similar to server 126, a portable computer, an embedded controller, a hand-held device, etc. Computer 130 may be coupled in a network 128 or may be a stand-alone device. Computer 130 will hereinafter also be referred to as a computer although it should be appreciated that the term computer may also include other suitable programmable electronic devices capable of allowing a chip designer to use a tool to design a correct and minimal set of clock constraints for a semiconductor product.

Figure 2:
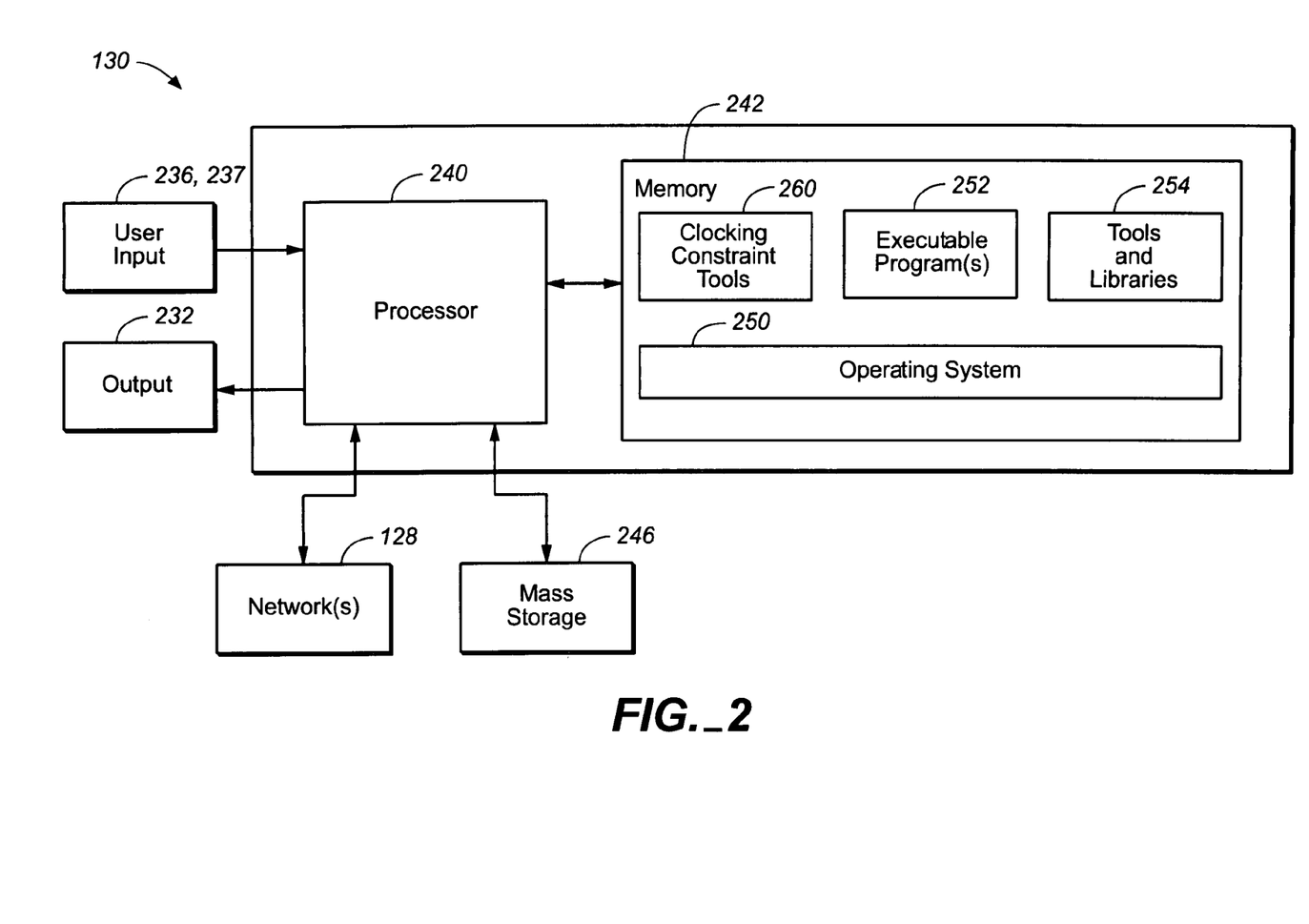
FIG. 2 a simplified block diagram of a computer processing apparatus upon which a tool to design a set of minimal correct clock constraints for a semiconductor product can be installed and used as an application.

With reference to FIG. 2 wherein the method and apparatus of correctly specifying, creating, and integrating clocks throughout the design process or flow for a semiconductor product as disclosed herein is installed as an application 260 on computer 130. Computer 130 typically receives a number of inputs and outputs for communicating information externally. For interface with a user or operator, computer 130 typically includes one or more user input devices 236, 237, e.g., a keyboard 136 and/or mouse 140 of FIG. 1, a trackball, a joystick, a touchpad, and/or a microphone, among others, and one or more output devices 232 such as a display 142 and/or a printer 144 of FIG. 1, a speaker, among others. Some servers, however, do not support direct user input and output. For additional storage, computer 130 may also include one or more storage devices 148 of FIG. 1, e.g., a floppy or other removable disk drive, a hard disk drive, a direct access storage device, an optical drive, e.g., a CD drive, a DVD drive, etc., and/or a tape drive, among others, that may be connected directly or other storage 246 that may be connected through a storage area network (SAN) or other network 128. Furthermore, computer 130 may include an interface connected to one or more networks 128, e.g., a local-area network, a wide-area network, a wireless network, and/or the Internet, among others, to permit communication of information with other computers 122, 124 coupled to the network 128. It should be appreciated that computer 130 typically includes suitable analog or digital interfaces between processor 240 and each of the components as is known in the art.

Computer 130 typically includes at least one processor 240 coupled to a memory 242. Processor 240 may represent one or more processors or microprocessors and memory 242 may represent the random access memory (RAM) devices comprising the main storage of computer 130, as well as any supplemental levels of memory such as cache memories, nonvolatile or backup memories, programmable or flash memories, read-only memories, etc. In addition, memory 242 may be considered to include memory storage physically located elsewhere, e.g., any storage capacity used as a virtual memory, e.g., as stored on a mass storage device 246 coupled to computer 130 with a SAN or on another computer coupled to computer 130 via network 128. Computer 130 may operate under the control of an operating system 250 such as a UNIX-based, LINUX-based, or WINDOWS-based operating system, as is known in the art, but is not so limited by the particular operating system, or indeed need not be under the control of any operating system. An operating system 250, either local or remote, typically executes various computer software applications, components, programs, objects, modules, etc., such as an executable program 252, etc. Although the tools and libraries 254 for developing an integrated circuit may be in memory 242, they need not be. The processor 240 may access the tools and libraries 254, the required data, other various applications components, programs, objects, modules, etc., resident on one or more processors in another computer coupled to computer 130 via a network 128, e.g., in a distributed or client-server computing environment whereby the processing to implement the functions of the applications may be allocated to multiple computers over a network. One of the applications may include the CORRECT CLOCK CONSTRAINT GENERATOR, as described herein, that could be interactive with the operating system 250, the tools and libraries 254, other executable programs 252 and the user.

In general, the program or method steps which cause a computer to capture the specification of, create and integrate the minimal and correct clock relationship specification, clock property information, and clock domain crossing information, and other clocking parameters during the design of a semiconductor product, whether implemented as part of an operating system or a specific application, component, program, object, module, or sequence of instructions, is referred to herein as the CORRECT CLOCK CONSTRAINT GENERATOR. The CORRECT CLOCK CONSTRAINT GENERATOR typically comprises one or more instructions that are resident at various times in various memory and storage devices in a computer, and that, when read and executed by one or more processors in a computer network, cause the same or other computer processors to perform the steps necessary to execute steps or elements embodying the various aspects of the invention. While the invention has and hereinafter will be described in the context of fully functioning computers and computer systems, those skilled in the art will appreciate that the various embodiments of the invention are capable of being distributed as a program product in a variety of forms and that the invention applies equally regardless of the particular type of signal bearing media used to actually carry out the distribution. Computer program code for carrying out operations of the present invention may execute entirely on the user's computer, partly on the user's computer, as a stand-alone software package, partly on the user's computer and partly on a remote computer or entirely on the remote computer. In the latter scenario, the remote computer may be connected to the user's computer through a network 128, for example, the Internet using an Internet Service Provider. Examples of signal bearing media include but are not limited to recordable type media such as volatile and nonvolatile memory devices, floppy and other removable disks, hard disk drives, optical disks, e.g., CD-ROMs, DVDs, etc., among others, and transmission type media such as digital and analog communication links.

Figure 3:
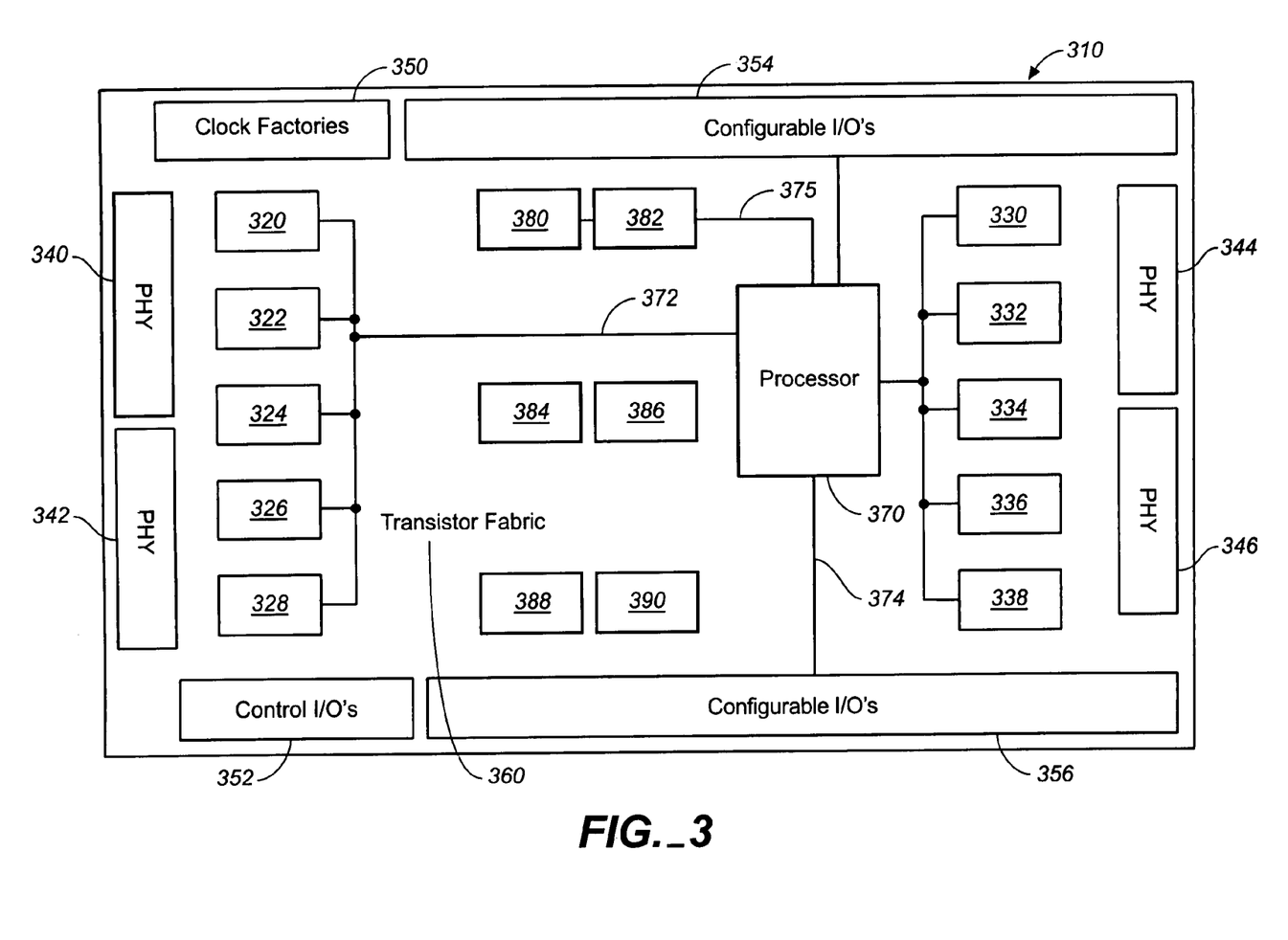
FIG. 3 is a simplified block diagram of a semiconductor platform having a number of components, each of which may be considered when designing a set of minimal correct clock constraints in accordance with an embodiment of the invention.

The CORRECT CLOCK CONSTRAINT GENERATOR can be used in the design of any semiconductor product ranging from field programmable gate arrays (FPGAs) to developing ASICs and/or fully-custom chips, such as ASSPs. Viewing FIG. 3, is a semiconductor platform upon which design requirements for a semiconductor product may be implemented. One of skill in the art will recognize that the semiconductor platform in FIG. 3 having fabricated wafer layers up to the connectivity layers, and in some instances, the first two or three connectivity layers, is only one embodiment of a platform upon which a semiconductor product can be implemented. The semiconductor platform as defined and used with the CORRECT CLOCK CONSTRAINT GENERATOR may be a base semiconductor wafer upon which the circuits have not been instantiated, or it may be a partially, or totally fabricated semiconductor platform upon which only the connective layers need to be created. For obtaining an overview, however, of the complexity involved with generating correct clocking constraints, the semiconductor platform 310 of FIG. 3 and some features of the partially manufactured platform will be discussed. The semiconductor platform 310 may have diffused memory 320-328, 330-338, data transceiver hardware such as I/O PHYs 340-346, phase-locked loops (PLLs) that can be used in creating clock factory elements 350, control I/Os 352, configurable input/output (I/O) hardmacs 354, 356 that have been fabricated, each having an optimum arrangement and density of transistors to realize its particular function. A platform 310, whether partially, totally, or not-at-all manufactured, may further comprise an area of transistor fabric 360 for further development using a suite of EDA tools, such as a suite of TOOLS referenced herein. The EDA tools and the CORRECT CLOCK CONSTRAINT GENERATOR may be part of the tools and libraries 254 of FIG. 2. The CORRECT CLOCK CONSTRAINT GENERATOR may also be a stand-alone design tool 260 in FIG. 2 compatible with other EDA tools.

The resource definitions of a semiconductor platform are a detailed listing of the resources, features, and restrictions, if any, of the platform including the availability, area, density of transistor fabric, and any other hardmacs, firmware, or softmacs, the requirements of the transistor fabric and hardmacs, the cost of the platform, the ideal performance that can be expected of the platform, the expected power consumption, and other functional requirements. Other details of the resource definitions may include the configuration of the transistor fabric and the diffused and compiled elements, the status of the logic, the required control signals and the features enabled by the control signals, whether any element undergoes testing, the location and the number of the elements on the platform, etc.

Using the CORRECT CLOCK CONSTRAINT GENERATOR and other design closure tools, a chip designer can integrate her/his design requirements to verify and synthesize designs generated by each tool, insert clocks, create the test interconnects, and then integrate the designs together to create a complete and correct design flow of the resultant semiconductor product using resource definitions of a semiconductor platform and the design requirements. A correct design flow, moreover, can be a qualified netlist with appropriate placement and routing amongst the existing resources, if any, of the platform and for external connections to a board. One or more EDA tools and interconnecting views can be used in the design flow depending upon the nature of the final semiconductor product.

Figure 4:
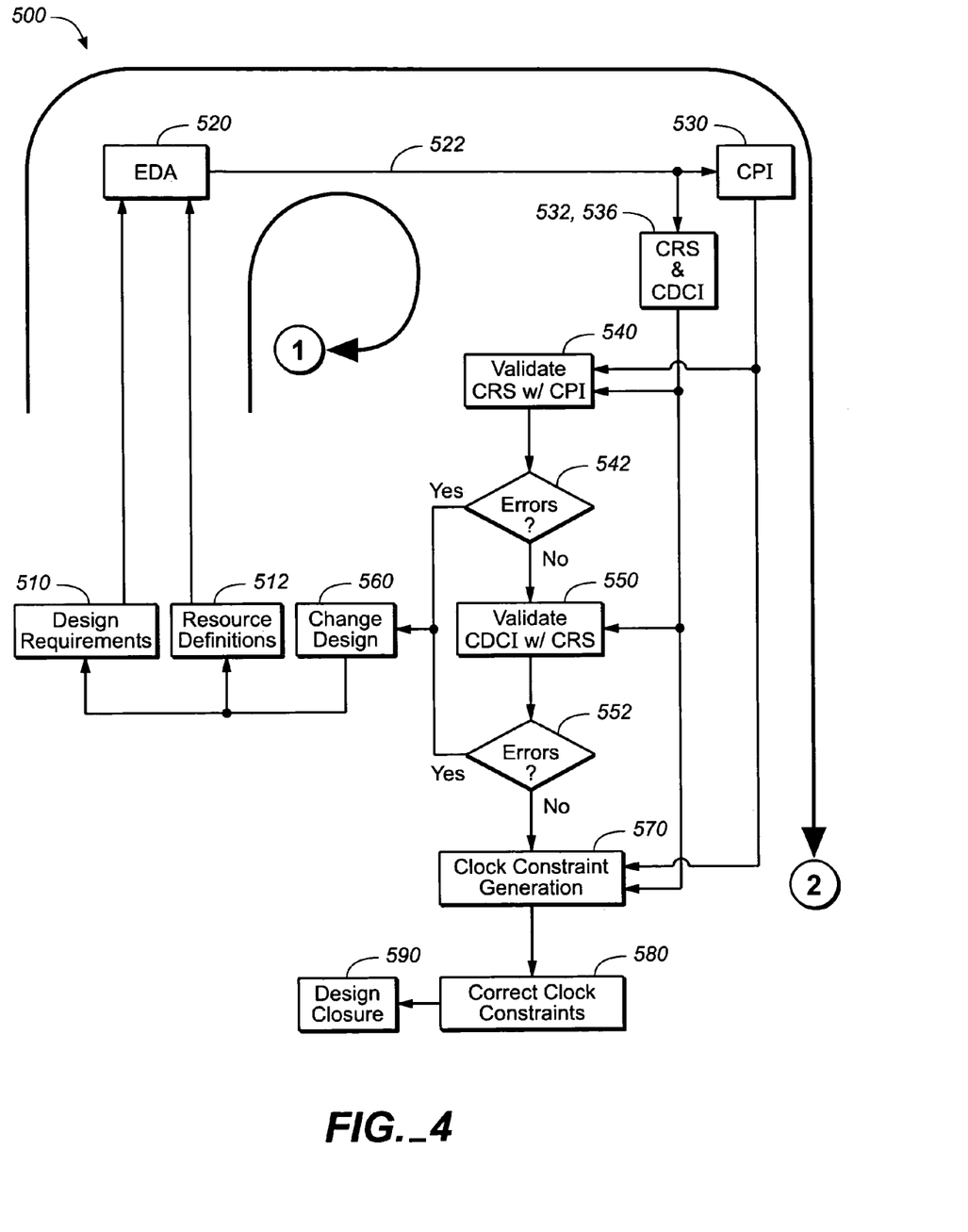
FIG. 4 is a simplified block diagram of a method by which a set of minimal correct clock constraints can be created in accordance with an embodiment of the invention.

FIG. 4 illustrates one embodiment of a process of determining a set of correct clock constraints by the CORRECT CLOCK CONSTRAINT GENERATOR. A designer desiring to have a semiconductor product designed, possibly as an partially manufactured platform, i.e., a platform ASIC, a FPGA, an ASIC or an ASSP, submits design requirements 510 of a representation of the logical functional circuits to be implemented on the semiconductor products, usually in the form of RTL and/or netlist descriptions that represent the logical and/or physical requirements desired to be achieved in the design. The design requirements likely will include preconfigured logical components and/or hardmacs, usually referred to intellectual property (IP). The design requirements are input to EDA tools 520. In addition, the resource definitions of the platform 512 are also input into the EDA tools 520 and, although described above, also may include clock source property specifications, clock specifications including clock relationships, and a clock domain crossing report. The resource definitions 512 will also provide any internal and/or external clocking specifications of the platform. The EDA tools used in the design flow along with the CORRECT CLOCK CONSTRAINT GENERATOR may include those described in copending United States patent applications, commonly owned by the assignee herein and hereby incorporated by reference in their entireties and referred to herein as the TOOLS: Ser. No. 10/435,168 filed 08 May 2003 entitled AUTOMATION OF THE DEVELOPMENT, TESTING, AND RELEASE OF A FLOW FRAMEWORK AND METHODOLOGY TO DESIGN INTEGRATED CIRCUITS, Ser. No. 10/318,792 filed 13 Dec. 2002 entitled FLEXIBLE TEMPLATE HAVING EMBEDDED GATE ARRAY AND COMPOSABLE MEMORY FOR INTEGRATED CIRCUITS, Ser. No. 10/318,623 filed 13 Dec. 2002 entitled AUTOMATED SELECTION AND PLACEMENT OF MEMORY DURING DESIGN OF AN INTEGRATED CIRCUIT, Ser. No. 10/325,114 filed 20 Dec. 2002 entitled FLOW CONTROL ENHANCEMENT, U.S. Pat. No. 6,823,502 entitled PLACEMENT OF CONFIGURABLE INPUT/OUTPUT BUFFER STRUCTURES DURING DESIGN OF INTEGRATED CIRCUITS; Ser. No. 10/335,360 filed 31 Dec. 2002 entitled A SIMPLIFIED PROCESS TO DESIGN INTEGRATED CIRCUITS; Ser. No. 10/465,186 filed 19 Jun. 2003 entitled DESIGNING AND TESTING THE INTERCONNECTION OF ADDRESSABLE DEVICES OF INTEGRATED CIRCUITS, Ser. No. 10/713,492 filed 14 Nov. 2003 entitled FLEXIBLE DESIGN FOR MEMORY USE IN INTEGRATED CIRCUITS; Ser. No. 11/003,309 filed 3 Dec. 2004 entitled POWER MESH FOR MULTIPLE FREQUENCY OPERATION OF SEMICONDUCTOR PRODUCTS, Ser. No. 10/017,017 filed 20 Dec. 2004 entitled LANGUAGE AND TEMPLATES FOR USE IN THE DESIGN OF SEMICONDUCTOR PRODUCTS; Ser. No. 11/017,015 filed 20 Dec. 2004 entitled RULES AND DIRECTIVES FOR VALIDATING CORRECT DATA USED IN THE DESIGN OF SEMICONDUCTOR PRODUCTS; and Ser. No. 027,266 filed 31 Dec. 2004 entitled GUIDED CAPTURE, CREATION, AND SEAMLESS INTEGRATION WITH SCALABLE COMPLEXITY OF A CLOCK SPECIFICATION INTO A DESIGN FLOW OF AN INTEGRATED CIRCUIT. Such EDA tools 520 may also include other RAPIDTOOLS by LSI LOGIC INC. and/or may include other known semiconductor design tools by other tool development companies. EDA tools 520 preferably also include physical synthesis tools and timing analysis tools, such as Design Compiler or Physical Compiler by SYNOPSYS, Amplify RapidChip by SYNPLICITY, or Encounter suite by MENTOR GRAPHICS. Design closure tools 590 may be included in the suite of EDA tools to facilitate the identification and resolution of many different kinds of design closure problems, such as timing, congestion, power, area, manufacturing testing, etc. Such design closure tools 590 include logical and physical synthesis tools, static timing analysis tools, manufacturing test insertion tools, RTL analysis tools, netlist analysis tools, etc.

Along path 522 and during a first-time through of the input as represented by the thick arrow labeled ①, these and/or other RTL or netlist analysis tools are used to create clock domain crossing information (CDCI) 536 that embodies how the design requirements 510 may actually be constructed relative to the clocks of the design requirements 510 and the resource definitions 512. The EDA tools output the clock property information (CPI) 530, the clock relationship specification (CRS) 534 and clock domain crossing information (CDCI) 536, preferably in a standarized consistent form, and the CORRECT CLOCK CONSTRAINT GENERATOR as described herein particularly makes use of these data.

Clock property information 530 comprises a number of different pieces of information. Of course, clock property information 530 includes basic clock parameters, such as an index and/or name for the clock, clock mode and modal versions of all the information as needed, frequencies, duty cycle, attachment points, divider, jitter, skew requirements, whether the clock is used for I/O or in the core of the semiconductor product, whether a clock and/or signal is triggered by a leading or trailing edges and delay times, clock sources, clock source types, clock source frequencies, etc. Clock property information 530 might be presented in tabular form as in FIG. 5B or, preferably, presented in a contextual graphical display such as disclosed in U.S. Ser. No. 11/027,266 filed 31 Dec. 2004 entitled GUIDED CAPTURE, CREATION, AND SEAMLESS INTEGRATION WITH SCALABLE COMPLEXITY OF A CLOCK SPECIFICATION INTO A DESIGN FLOW OF AN INTEGRATED CIRCUIT, incorporated by reference in its entirety above. Clock property information 530 also indicates if the clocks are intended to or actually share a common time base; this information is particularly important if the common time base is located off chip. Clock property information 530 also includes the number of other clocks to which a specific clock can be related, referred to as bounds. A clock's reservations as part of the clock property information 530 may further include the details of the other clocks to which a specific clock is related, e.g., inserting delay removal and timing closure for a clock derived from or used outside the final semiconductor product, or those clocks generated and/or used by the chip itself derived from the core. Other limitations contained in the clock property information 530 include restrictions on sharing a clock, and inserting a clock mid-chain to other chains, the maximum chaining limits for a clock, i.e., the number of clocks that can be connected in chain, etc., and the information necessary for equivalent clock information tracing, e.g., ClockD is derived from ClockC which is derived from ClockB which is derived from ClockA. One of skill in the art will realize that while the clock property information given is intended to describe many properties of clocks in a semiconductor product, it is also recognized by the inventors that other semiconductor development tools may use clock property information not mentioned herein. The method of the invention is intended to be able to use this other clock property information derivable from the tools and/or presented with the resource definitions 512.

Figure 5A:
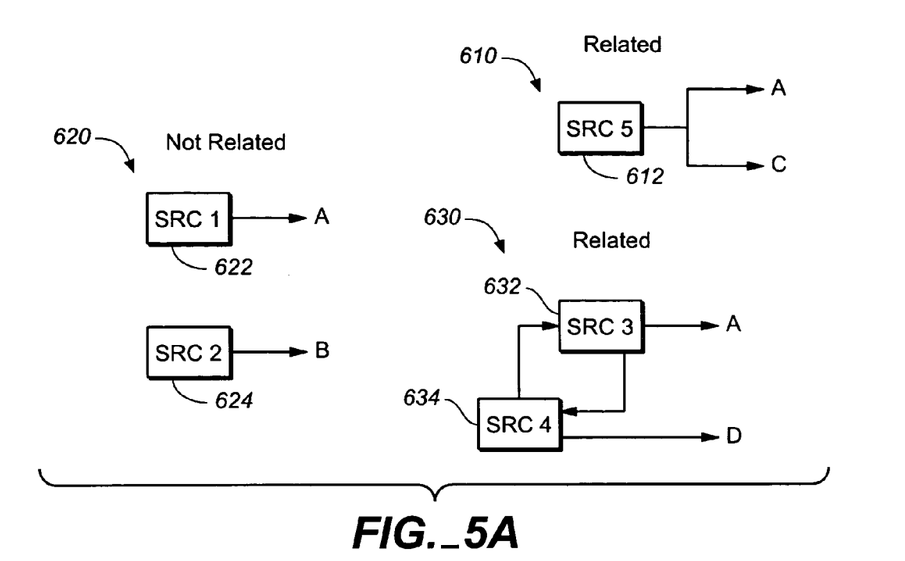
FIGS. 5A and 5B present clock source relationship specifications that can be used by a method and an apparatus to design a set of minimal correct clock constraints in accordance with an embodiment of the invention.

The clock relationship specification 532 is also important information used by the CORRECT CLOCK CONSTRAINT GENERATOR. FIG. 5A illustrates three examples of clock relationships. Example 610 illustrates two related Clocks A and C controlled from the same source, SRC5 612. Thus, the defined relationship is that clocks A and C have the same source. The relationship shown in example 630 has two clocks A and D with different sources, i.e., clock A is derived from SRC3 632, and clock D is derived from SRC4 634, but clocks A and D are nonetheless related because the two sources, SRC3 632 and SRC4 634, pass timing information or otherwise interact with each other. An example of unrelated or independent clocks is shown in example 620; clock A has its source SRC1 622 and clock 5 has its source SRC2 624. The two sources and their respective clocks do not share a common timebase. Defaults may be established in the CORRECT CLOCK CONSTRAINT GENERATOR if clock relationships are not explicitly specified, for instance, unless otherwise specified, clocks may be presumed to be unrelated.

Figure 6A:
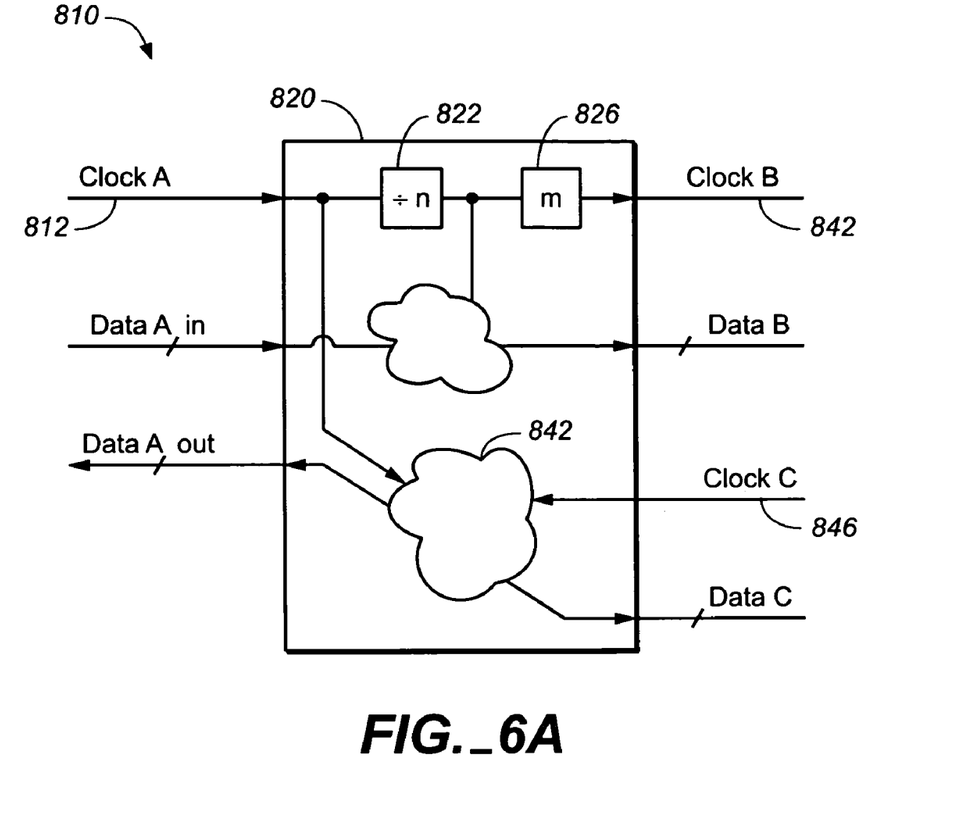
FIGS. 6A and 6B present a simplified block diagram of an electronic circuit having at least one clock and the clock relationship specification of the block diagram for which a set of minimal correct clock constraints can be created in accordance with an embodiment of the invention.
Figure 6B:
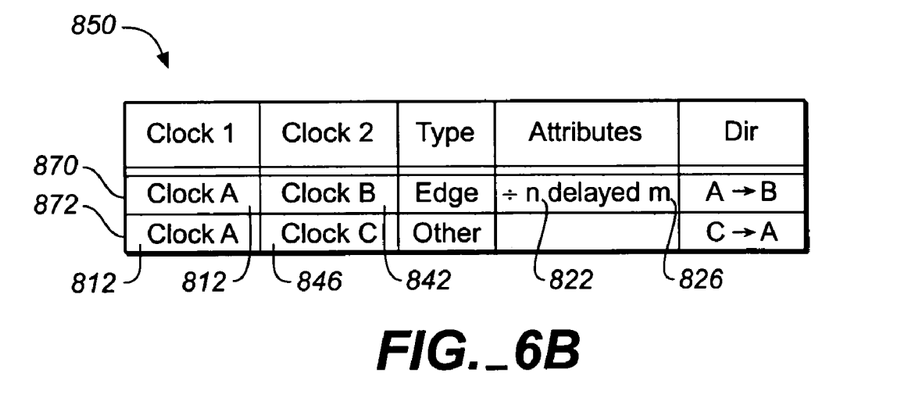

Clock domain crossing information is also used by the CORRECT CLOCK CONSTRAINT GENERATOR. FIGS. 6A and 6B present clock domain crossing information and the clock relationship specification, respectively, for the same circuit 810. Circuit logic 820 has two clock inputs: ClockA 812 and ClockC 846; and one clock output ClockB 842. Input ClockA 812 is first divided-by-n at 822 and then delayed-by-m 826 to yield ClockB; this clock relationship is shown in row 870 of FIG. 6B. ClockA 812 and ClockC 846 are input into combinatorial logic 842 where it clocks the output of DataA and DataC. The clock relationship specification between ClockA 812 and ClockC 846 is presented in row 872 of FIG. 6B. One of skill in the art will realize that the clock relationship specification of an actual logic circuit may be immensely more complicated. Clock relationship specification 850 can also provide other information such at the type of clock and direction, and the chart herein is not intended to be limitative as to the type of clocking property information and clock relationship specification that must be considered when creating a set of correct clock constraints. Note that clock domain crossing information also includes the information that there is only clock domain in the final semiconductor product; or that there are not clock domains interacting or crossing with other clock domains.

Figure 7A:
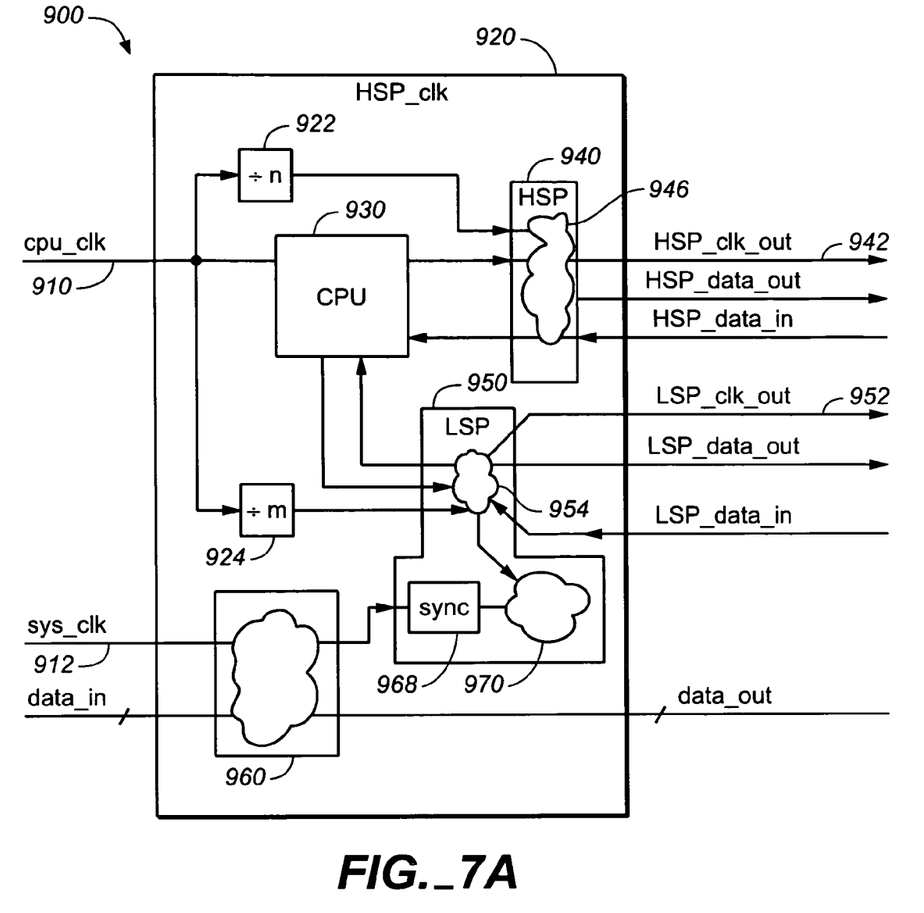
FIGS. 7A and 7B present a simplified block diagram and a clock relationship specification of another electronic circuit for which a set of minimal correct clock constraints can be created in accordance with an embodiment of the invention.
Figure 7B:
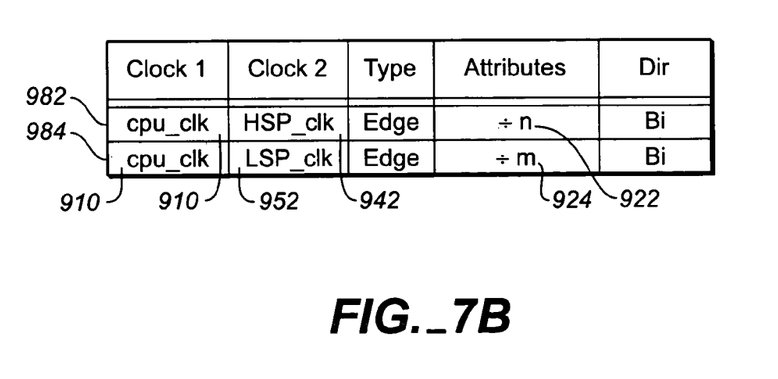

FIGS. 7A and 7B show a more complex logic circuit 900 and its clock relationship specification, respectively, that may exist between clocks for an integrated circuit 920. Four clock domains exist in the circuit 920: a central processing unit 930 clocked by the cpu_clk 910, a high speed HSP clock domain 940, a low speed LSP clock domain 950, and a system clock domain 960. The relationships between the clocks, however, may not be so complex, as shown in the clock relationship specification represented below. Following along: cpu_clk 910 and HSP_clk 942 are related through divide-by-n logic 922; cpu_clk 910 and LSP_clk 952 are also related by a divide-by-m circuit 924. System clock sys_clk 912 is also input in the low speed LSP clock domain 950. Note, however, in the clock relationship specification shown in FIG. 8B, that the only clock relationship specifications are the relationship between the cpu_clk 910 and the HSP_clk 942 shown on row 982, and the relationship between cpu_clk 910 and LSP_clk 952 shown on row 984. In this instance, a default mentioned above takes effect; because no relationship of sys_clk 912 to LSP_clk 952 was provided in the customer's specification or the application set, it is assumed that the system clock domain 960 and the low speed clock domain 950 are asynchronous domains, i.e., do not have a common time base.

Figure 8A:
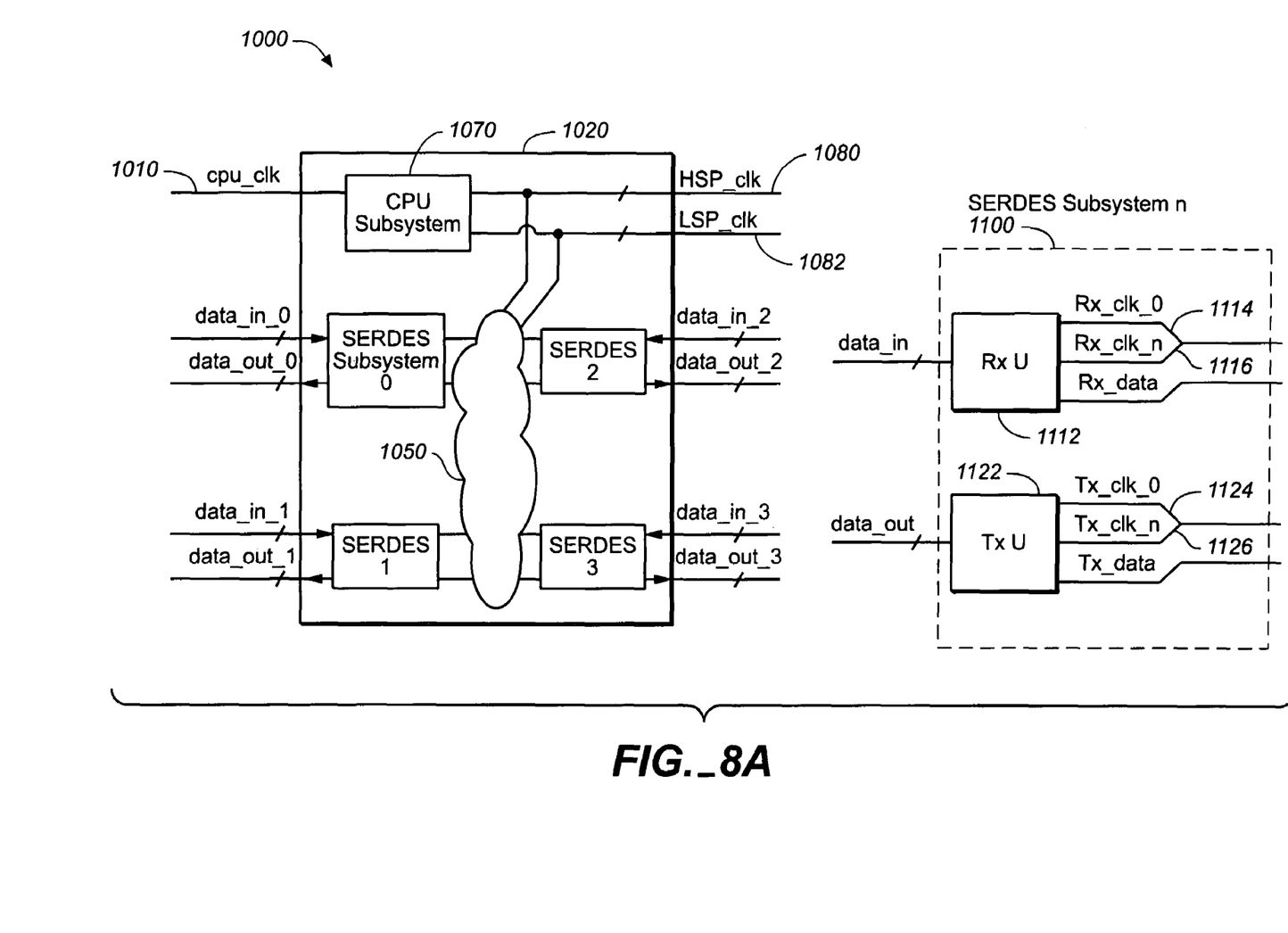
FIGS. 8A and 8B present a simplified block diagram and a clock relationship specification of yet another electronic circuit for which a set of minimal correct clock constraints can be created in accordance with an embodiment of the invention.
Figure 8B:
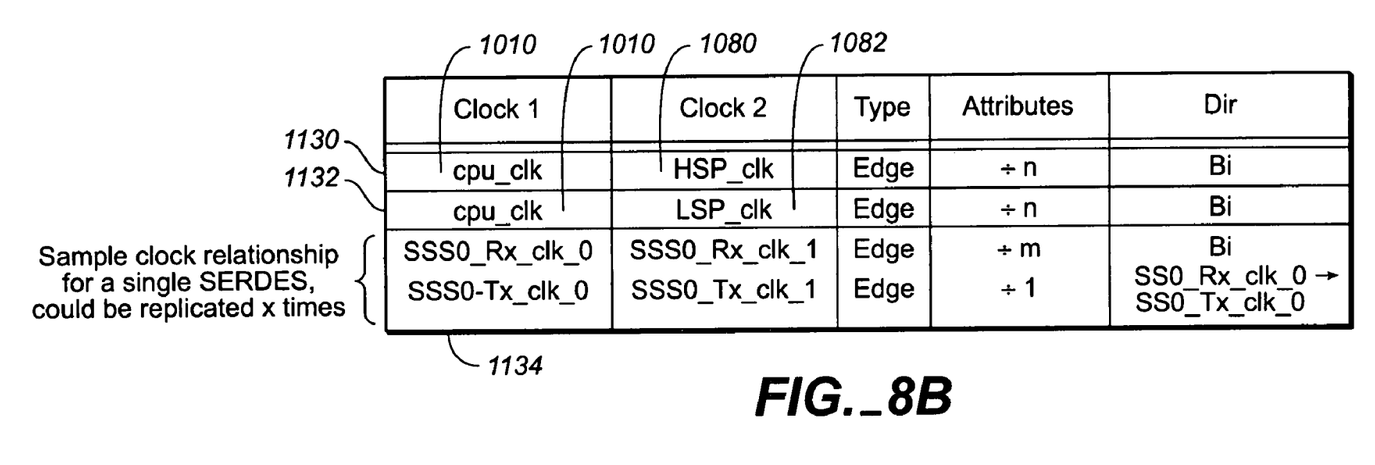

FIGS. 8A and 8B provide yet another example of a complex circuit 1000 and its clock relationship specification. To simplify the diagram, only the clocking relationship specification and the clock domain crossing information are presented and discussed. The semiconductor product 1000 may be a input/output chip having many different serializers/deserializers (SERDES) subsystems 1100, although only four are shown in FIG. 8A. The overall semiconductor product is clocked by a cpu_clk 1010 which is related to both a HSP_clk 1080 and a LSP_clk 1082. Each SERDES subsystem, moreover, has a receiver unit 1112 and a transmitter unit 1122. Each receiver unit 1112 may be clocked by a Rx_clk_0 1114 or a Rx_clk_n 1116; similarly, each transmitter unit 1122 may be clocked by a Tx_clk_0 1124 or a Tx_clk_n 1126. The clock relationship specification shown in FIG. 8B provides the relationships of the cpu_clk 1010 to the HSP_clk 1080 and the LSP_clk 1082 on rows 1030 and 1032, respectively. Then a sample clock relationship for one SERDES subsystem 1100 is shown. One of skill in the art will appreciate that there may be many SERDES subsystems and thus a row 1134 having two entries, one for the receiver and another for the transmitter, will be inserted in the clock specification table for each SERDES subsystem.

Figure 9:
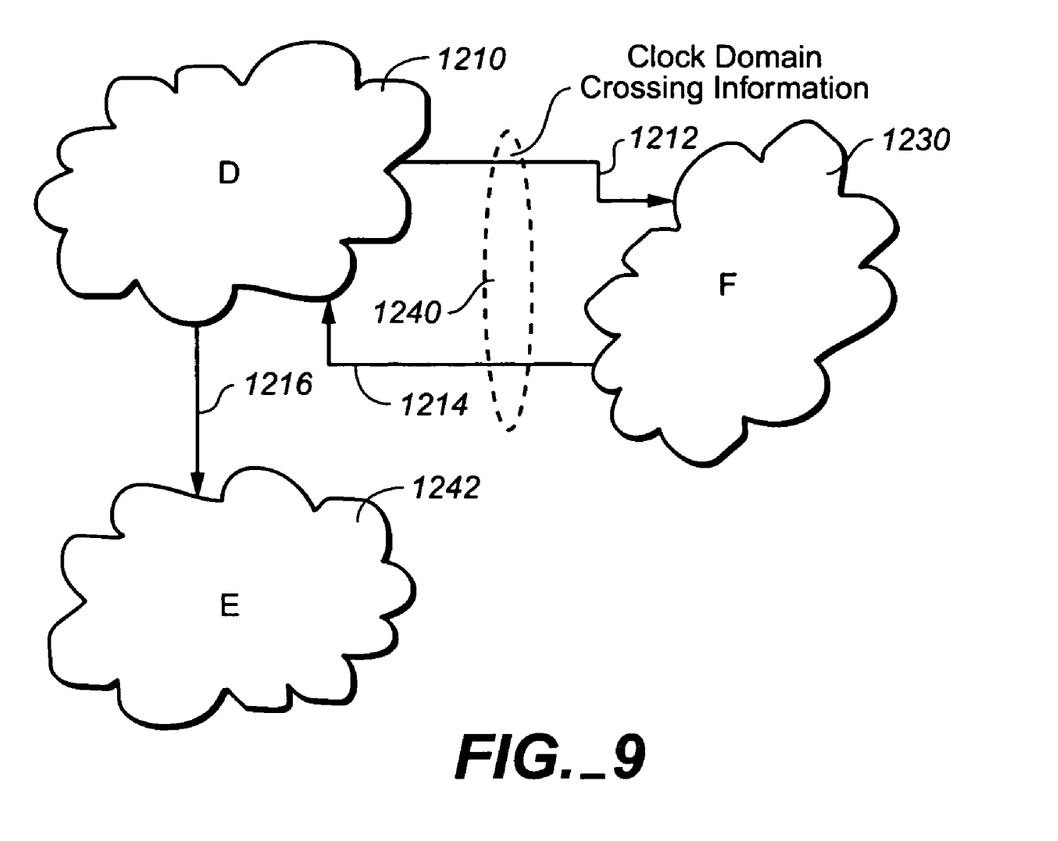
FIG. 9 is an abstraction of clock domains and clock domain crossing information which can be used by a method and apparatus to generate a set of minimal correct clock constraints in accordance with an embodiment of the invention.

FIG. 9 represents clock domain crossing information. In general, a clock domain includes all the starting points and endpoints that are common to a single point and/or clocked by the same clock, for instance if a memory element or latch A and a memory element or latch B are clocked by the same clock, they may be considered to be in the same domain. In actuality, however, a clock domain may be further defined by the user for various uses and understandings, such as whether an event or latch is triggered by the same or different clock. Three clock domains are shown: domain D 1210 which provides output to domain E 1220 along path 1216 and to domain F 1230 along path 1212. Domain F 1230 in turn also provides input to domain D 1210 along path 1214. The clock domain crossing information is included in some combinatorial logic 1240. Returning briefly to FIG. 6A, combinatorial logic 842 provided a relationship between ClockA 812 and ClockC 846, which could be two separate domains. Briefly returning to FIG. 7A, there were four clock domains: (1) combinatorial logic 946 provides clock domain crossing information between the cpu_clk 910/cpu domain 930 and the HSP domain 940/HSP clk_out 942; (2) combinatorial logic 954 provided clock domain crossing information between cpu_clk 910/cpu domain 930 and the LSP domain 950/LSP_clk_out 952; (3) combinatorial logic 970 may provide clock domain crossing information between sys_clk 912/system domain 960 and the LSP domain 950 although an error might well be flagged because the relationship was not specified. The error will be further expounded upon in the remaining discussion of the flow chart of FIG. 4.

Returning to FIG. 4, the clock domain crossing information 536 indicates whether a clock is involved with a domain crossing. The clock relationship specification 532 and clock domain crossing information 536 comprise specified clock relationships and actual clock domain relationships. The clock relationship specification 532 is validated with clock property information 530 at step 540 verifying the clocks' logical relationships to each other and ensuring that valid clocks are selected. When two clocks share a common timebase, they are related but whether or not this information is used depends upon the design requirements 510. It is not enough to have the possibility of a relationship; the design tools must create and maintain an actual relationship. If two clock domains are unrelated, then they may be connected by an asynchronous domain crossing circuit, referred to herein as combinatorial logic (see logic 842 of FIG. 6A, logic 946, 954 of FIG. 7A, logic 1050 of FIG. 8A). There are many possible implementations of the combinatorial logic and/or other interfaces in the art but all share a common goal of ensuring that information at an interface is passed correctly from one clock domain to another. Clock domain crossing information describes the properties of a given path when a path begins in one clock domain and terminates in another domain.

For instance, in step 542, an error condition may occur if the clock relationship specification 532 indicates that two clocks are related but the clock property information 530 indicates that the two clocks do not share a common time base. In this instance, the CORRECT CONSTRAINT CLOCK GENERATOR may propose several corrective actions to a circuit designer. The clock relationship specification 532 and/or the clock property information 530 derived from the resource definitions 512 may be changed. Alternatively, if the design requirements 510 may not be able to be satisfied or are in error, then the user may change the design requirements 510, as in step 560, to establish a common time base for the two or more clocks. Alternatively, the user may eliminate the clock domain crossing in the logic; or the user may insert an appropriate asynchronous interface and deal with the issues associated with adding such a circuit that may have been suggested by the CORRECT CONSTRAINT CLOCK GENERATOR.

Another error that may occur in step 542 indicates that the clock relationship limits specified in the clock relationship specification 532 are exceeded based on the capabilities of the design requirements or specific design flow. Corrective action may entail correcting either or both the design requirements 510 and the resource definitions 512 to modify the clock relationship specification 532 and the clock property information 530. If, however, the error is in neither, then the design requirements may not be satisfiable and the CORRECT CLOCK CONSTRAINT GENERATOR may suggest changes to the design requirements as in step 560, such as to reduce the requirements beneath the maximum limits, or eliminate the clock domain crossing in the logic, or insert an appropriate asynchronous interface and adjust the logic for the induced propagation latency.

Figure 5B:
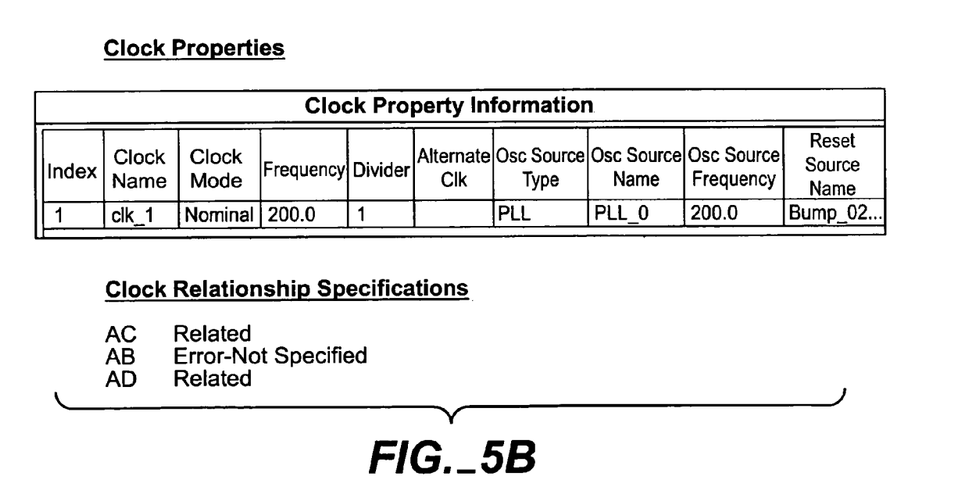

FIG. 5B provides an example of how the CORRECT CLOCK CONSTRAINT GENERATOR validates the clock relationship specification 532 based on the clock property information 530. The clock relationship specification 532 shows the possible connections, such as ClockA and ClockC are related as shown in FIG. 5A; similarly ClockA and ClockD are related. The CORRECT CLOCK CONSTRAINT GENERATOR has returned an error stating that ClockB and ClockC have no relationship in the clock relationship specification 532.

Once the clock relationship specification 530 is valid with no errors in step 542 along the path of arrow ①, the clock relationship specification 530 validates the clock domain crossing information in step 550 and the flow proceeds through steps 552 along the path of arrow ②. An error that may be detected in step 552 is that the clock domain crossing information 536 indicates a synchronous domain crossing but the clock relationship specification 532 indicates there is no clock relationship. Corrective action requires that the design requirements 510 of the circuit be examined in conjunction with the clock relationship specification 532 and if the clock relationship specification 532 is in error, then it will have to be changed either by modifying the design requirements 510 or the resource definitions 512. Alternatively, the design requirements 510 may not be realizable so must be changed, as in step 560. Possible correction may be to eliminate the clock domain crossing in the logic of the design, or to insert an appropriate asynchronous interface and then deal with the induced propagation latency.

Another error that can be detected in step 552 is that the clock domain crossing information 536 fails to indicate a synchronous domain crossing while the clock relationship specification 532 indicates there is a relationship. As before, either the clock relationship specification 532 is in error so the design requirements 510 and/or the resource definitions 512 must be changed. Or if the design is in error, then the design requirements 510 can be changed in step 560 to create an appropriate interface.

Still a different error can occur in step 552—the clock domain crossing information 536 indicates a cross domain asynchronous reset implying a clock relationship between the resets of the parent clock and the target clock but the clock relationship specification 532 indicates there is no clock relationship. This is the case in FIGS. 7A and 7B, wherein the circuit diagram of FIG. 7A showed a synchronous circuit 968 between the system clock domain 960 and the LSP clock domain 950, but the clock relationship specification of FIG. 7B indicated there was not relationship between the sys_clk 912 and the LSP_clk_out 952. To correct, then the design requirements 510 and/or the resource definitions 512 could be changed to correct the clock relationship specification 532. Alternatively, the design can be changed in step 560 to change reset sources of the parent clock and the target clock to eliminate the domain crossing; or the reset can be resynchronized to a compatible clock domain; or the reset can be changed to a cross domain synchronous reset and a cross domain asynchronous clock domain crossing circuit would be required.

Once both the clock relationship specification 532 and the clock domain crossing information 536 are found valid then the clock property information 530 and clock relationship specification 532 are passed in step 570 to the CORRECT CLOCK CONSTRAINT GENERATOR wherein the correct minimal clock constraints 580 are generated in accordance with the principles of the invention. Among the constraints generated are timing constraints, physical optimization constraints, and other commands to a synthesis tool or other pertinent tool. Constraints are commands or information that embody the resource definitions and the design requirements and intent for the design for a particular design tool or set of design tools in a particular design flow. This invention generates correct and minimal timing constraints for a given tool; in other words, the CORRECT CLOCK CONSTRAINT GENERATOR, inter alia, provides a correct specification of the clocks comprising timing and physical optimization constraints for a semiconductor product given the design requirements and the resource definitions in a format that is specific to a design tool. The timing constraints generated are commands to a synthesis tool or static timing analysis tool that state the definitions and boundaries of the timing of the circuit for the semiconductor product. Physical optimization constraints are commands to a synthesis or physical optimization tool of the requirements about physical implementation and physical characteristics of the semiconductor product that need to be respected, e.g., all clocks are to be treated as ideal networks, or that one clock must lead or trail another by a set amount, or that the clock generation logic be placed by its clock source, etc. Following are examples of some constraints:

```
create_clock -period {5.0} -waveform {0.0 2.5}
  -name {CLKA} [get_pins {top level/L1/L2/block name/pin #} ]
create_clock -period clock_period -waveform {clock_waveform}
  -name {clock_name } [get_ports { clock_path } ] 
create_generated_clock -name {clock_name} -divide_by
  clock_divider
  -source oscillator_source [get_pins {clock_path}]
```

Additionally, if latencies or uncertainties are specified, the following constraints may be generated for clock_name:

```
set_clock_uncertainty clock_uncertainty [get_clocks
  {clock_name}]
set_clock_latency clock_latency [get_clocks
  {clock_name}].
```

Thus, the process is an automated iterative and converging process following the arrow ② that updates the design requirements 510, the resource definitions 512, and the clocking constraints while the invention revalidates the design until the design stops changing and everything is brought into concurrence. Maintenance of the clocking constraints then, which is a critical aspect of semiconductor design, becomes much easier. Thus, while the description provides embodiments of the invention, the embodiments are considered illustrative and by way of example only and are not intended to be limitative. Rather, the invention is as claimed is:

What is claimed is:

1. A method to generate clock constraints for a design flow of a semiconductor product, the method comprising steps of:
   (a) inputting resource definitions of a semiconductor platform having least one clocking function;
   (b) inputting design requirements of at least one desired clocking function to be implemented on the semiconductor product;
   (c) determining if the design requirements are consistent with and physically realizable from the resource definitions;
   (d) creating a set of clocking constraints when the design requirements are consistent with and physically realizable from the resource definitions; and
   (e) automatically generating correct and minimal clock constraints for the semiconductor product.

2. The method of claim 1 further comprising steps of:
   deriving clock property information; and
   deriving clock domain crossing information from the resource definitions.

3. The method of claim 2 further comprising a step of deriving clock relationships from the design requirements.

4. The method of claim 3, step (d) further comprising validating the clock relationships with the clock property information.

5. The method of claim 3, step (d) further comprising validating the clock domain crossing information with the clock relationships.

6. The method of claim 5, the clocking function further comprising an internal clocking function.

7. The method of claim 5, the clocking function further comprising an external clocking function.

8. The method of claim 2 further comprising steps of:
one of modifying the resource definitions when the design requirements are not consistent and not physically realizable from the resource definitions and modifying the design requirements until the clock relationships are valid with the clock property information and the clock domain crossing information is valid with the clock relationships;
creating a set of clocking constraints; and
automatically generating correct and minimal clock constraints for the semiconductor product.

9. The method of claim 8, the clock constraints further comprising timing constraints and physical optimization constraints.

10. A method to generate clock constraints for a design flow of a semiconductor product, the method comprising steps of:
(a) inputting resource definitions having at least one clocking function;
(b) inputting design requirements of at least one desired clocking function to be implemented on the semiconductor product;
(c) generating clock property information from the resource definitions;
(d) generating clock relationship specification from the resource definitions;
(e) generating clock domain crossing information from the resource definitions and the design requirements;
(f) validating the clock relationship specification with the clock property information;
(g) validating the clock domain crossing information with the clock relationship specification; and
(h) automatically generating correct and minimal timing constraints and physical optimization constraints for the design requirements.

11. An electronic design automation tool comprising:
a first validator to determine if a clock relationship specification derived from resource definitions is consistent with clock property information also derived from the resource definitions;
a second validator to validate clock domain crossing information derived from the resource definitions and design requirements; and
a generator for automatically generating correct and minimal clock constraints for the semiconductor product.

12. The electronic design automation tool of claim 11 further comprising a first error indicator to indicate when the first validator determines that the clock relationship specification is not consistent with the clock property information.

13. The electronic design automation tool of claim 12 further comprising a second error indicator to indicate when the second validator determines that clock domain crossing information is not consistent with the clock relationship specification.

14. The electronic design automation tool of claim 11 further comprising a clock constraint generator that generates correct and minimal timing and physical optimization constraints when the clock domain crossing information and the clock property information and the clock relationship specification are all consistent with one another.

15. An apparatus to generate clock constraints for a design flow of a semiconductor product, the apparatus comprising:
means (a) for inputting resource definitions of a semiconductor platform having least one clocking function;
means (b) for deriving clock property information from the resource definitions;
means (c) for deriving clock domain crossing information from the resource definitions;
means (d) for inputting design requirements of at least one desired clocking function to be implemented on the semiconductor product;
means (e) for deriving clock relationships from the design requirements;
means (f) for determining if the design requirements are consistent with and physically realizable from the resource definitions;
means (g) for creating a set of clocking constraints when the design requirements are consistent with and physically realizable from the resource definitions; and
means (h) for automatically generating correct and minimal clock constraints for the semiconductor product.

16. The apparatus of claim 15, means (I) further comprising means for validating the clock relationships with the clock property information.

17. The apparatus of claim 15, means (I) further comprising means for validating the clock domain crossing information with the clock relationships.

18. The apparatus of claim 15 further comprising:
means for modifying the resource definitions when the design requirements are not consistent and not physically realizable from the resource definitions;
means for modifying the design requirements until the clock relationships are valid with the clock property information and the clock domain crossing information is valid with the clock relationships;
means for creating a set of clocking constraints; and
means for automatically generating correct and minimal timing constraints and physical optimization constraints for the semiconductor product.

19. A computer readable storage medium tangibly embodying instructions for a computer that when executed by the computer implement a method for generating clock constraints for a design flow of a semiconductor product, the method comprising steps of:
receiving as input resource definitions of a semiconductor platform having at least one clocking function;
receiving as input design requirements of at least one desired clocking function to be implemented on the semiconductor platform;
generating clock property information from the resource definitions;
generating a clock relationship specification from the resource definitions;
generating clock domain crossing information from the resource definitions and the design requirements;
validating the clock relationship specification with the clock property information; and
validating the clock relationship specification with the clock domain crossing information; and
automatically generating correct and minimal timing constraints and physical optimization constraints for the semiconductor product.

20. The computer readable storage medium of claim 19, the method farther comprising a step of invoking errors when the clock relationship specification is not consistent with the clock property information.

21. The computer readable storage medium of claim 19, the method further comprising a step of invoking errors when the clock domain crossing information is not consistent with the clock property information.

22. A method comprising steps of:
validating a clock relationship specification with clock domain crossing information;
validating clock property data with the validated clock relationship specification;
automatically generating correct and minimal timing constraints and physical optimization constraints from the validated clock property data.

* * * * *